(12) United States Patent
Hong et al.

(10) Patent No.: US 9,728,605 B2
(45) Date of Patent: Aug. 8, 2017

(54) ROLL-TO-ROLL DOPING METHOD OF GRAPHENE FILM, AND DOPED GRAPHENE FILM

(71) Applicant: Graphene Square Inc., Seoul (KR)

(72) Inventors: Byung Hee Hong, Seoul (KR); Jonghyun Ahn, Suwon-si (KR); Hyeong Keun Kim, Hwaseong-si (KR); Sukang Bae, Suwon-si (KR)

(73) Assignee: Graphene Square, Inc., Seoul (KR)

( * ) Notice: Subject to any disclaimer, the term of this patent is extended or adjusted under 35 U.S.C. 154(b) by 0 days.

(21) Appl. No.: 14/581,315

(22) Filed: Dec. 23, 2014

(65) Prior Publication Data

US 2015/0162408 A1 Jun. 11, 2015

Related U.S. Application Data

(60) Division of application No. 13/539,780, filed on Jul. 2, 2012, now Pat. No. 8,926,854, which is a
(Continued)

(30) Foreign Application Priority Data

Dec. 30, 2009 (KR) .................. 10-2009-0134654

(51) Int. Cl.
| | |
|---|---|
| *B32B 9/00* | (2006.01) |
| *H01L 29/16* | (2006.01) |
| *C01B 31/04* | (2006.01) |
| *B29B 15/08* | (2006.01) |
| *B29B 15/12* | (2006.01) |
| *B82Y 30/00* | (2011.01) |

(Continued)

(52) U.S. Cl.
CPC .......... *H01L 29/1606* (2013.01); *B29B 15/08* (2013.01); *B29B 15/125* (2013.01); *B82Y 30/00* (2013.01); *B82Y 40/00* (2013.01); *C01B 31/0438* (2013.01); *C01B 31/0484* (2013.01); *H01L 21/041* (2013.01); *H01L 21/223* (2013.01); *H01L 21/228* (2013.01); *H01L 29/167* (2013.01); *B29K 2105/162* (2013.01); *Y10T 428/30* (2015.01)

(58) Field of Classification Search
CPC .............. Y10T 428/30; C01B 31/0438; C01B 31/2204; B82Y 10/00; C23C 16/00
USPC ........... 428/408; 165/185; 423/448; 252/500
See application file for complete search history.

(56) References Cited

U.S. PATENT DOCUMENTS

2007/0125493 A1* 6/2007 Jang .................. B29C 43/222
                                                                156/324
2008/0029640 A1 2/2008 Chiu et al.
(Continued)

FOREIGN PATENT DOCUMENTS

| JP | 2009-062247 | 3/2009 |
|---|---|---|
| KR | 10-2009-0056117 A | 6/2009 |
| WO | 2008/108383 A1 | 9/2008 |

OTHER PUBLICATIONS

Int'l. Search report of PCT/KR2010/009492 dated Sep. 26, 2011 (8 pages, published with English language translation).
(Continued)

*Primary Examiner* — Daniel H Miller
(74) *Attorney, Agent, or Firm* — Greer Burns & Crain Ltd.

(57) ABSTRACT

The present disclosure relates to roll-to-roll doping method of graphene film, and doped graphene film.

10 Claims, 11 Drawing Sheets

Related U.S. Application Data continuation of application No. PCT/KR2010/009492, filed on Dec. 29, 2010.

(51) Int. Cl.
| | | |
|---|---|---|
| *B82Y 40/00* | (2011.01) | |
| *H01L 21/04* | (2006.01) | |
| *H01L 21/223* | (2006.01) | |
| *H01L 21/228* | (2006.01) | |
| *H01L 29/167* | (2006.01) | |
| *B29K 105/16* | (2006.01) | |

(56) References Cited

U.S. PATENT DOCUMENTS

| | | |
|---|---|---|
| 2008/0312088 A1 | 12/2008 | Chung et al. |
| 2009/0140801 A1 | 6/2009 | Ozyilmaz et al. |
| 2009/0146111 A1 | 6/2009 | Shin et al. |
| 2009/0226684 A1 | 9/2009 | Bahnmuller et al. |
| 2013/0180581 A1 | 7/2013 | Choi |

OTHER PUBLICATIONS

Xie et al., "Controlled Fabrication of High-Quality Carbon Nanoscrolls from Monolayer Graphene", Nano Letters, vol. 9, No. 7, 2565-2570, 2009 (6 pages, in English).

Bae et al., "Roll-to-Roll Production of 30-inch Graphene Films for Transparent Electrodes", Jun. 2010, Nature Nanotechnology, vol. 5, pp. 574-578.

Gunes et al., "Larged-Area Graphene-based Flexible Transparent Conducting Films", Apr. 2009, Nano, 04, 83, one page.

Final Office Action issued in U.S. Appl. No. 13/539,780 mailed Jun. 30, 2014.

Non-final Office Action issued in U.S. Appl. No. 13/539,780 mailed Nov. 15, 2013.

\* cited by examiner

ROLL-TO-ROLL DOPING METHOD OF GRAPHENE FILM, AND DOPED GRAPHENE FILM

CROSS-REFERENCE TO RELATED APPLICATION

This application is a Divisional of application Ser. No. 13/539,780, filed Jul. 2, 2012, which is a Continuation of International Application No. PCT/KR2010/009492 filed Dec. 29, 2010, which claims the benefits of Korean Patent Application No. 10-2009-0134654 filed Dec. 30, 2009. The entire disclosure of the prior application is incorporated herein by reference in its entirety.

FIELD OF THE INVENTION

The present disclosure relates to a roll-to-roll doping method of a graphene film and a graphene film doped by the method, in particular, to a roll-to-roll doping method, which includes doping the graphene film by immersing the graphene film in a solution containing a dopant and passing the graphene film through the solution by using a roll-to-roll process, a graphene film doped by the method, and a device using the same.

BACKGROUND OF THE INVENTION

As low-dimensional nano-materials consisting of carbon atoms, there are fullerene, a carbon nanotube, graphene, graphite, and the like. That is, if carbon atoms are arranged in a hexagonal shape to form a ball shape, fullerene having a zero (0)-dimensional structure is obtained. If carbon atoms are one-dimensionally rolled, a carbon nanotube is obtained. If carbon atoms form one two-dimensional atom layer, graphene is obtained. If carbon atoms are three-dimensionally stacked, graphite is obtained.

Particularly, electrical, mechanical, and chemical characteristics of graphene are highly stable and excellent. The graphene is a highly conductive material, which can move electrons 100 times faster than silicon and enable flow of about 100 times more currents than copper. The characteristics of the graphene have been verified through experiments since discovery of a method of isolating the graphene from graphite in 2004. Since then, a great deal of research on this matter has been carried out.

Since the graphene is composed of only carbons, which are relatively light atoms, it facilitates processing of a one- or two-dimensional nanopattern. By using the graphene, semiconductive-conductive properties can be adjusted. By using diversity of chemical bonds of carbons, wide-range functional devices such as sensors and memories can be fabricated.

However, due to lack of a method for effective synthesis, transfer, and doping, quality and a scale required to actually produce a graphene film have been restricted. For example, a conventional transparent electrode, such as an indium tin oxide (ITO), which is generally used for a solar cell, exhibits unlimited scalability, ~90% of optical transparency, and a sheet resistance smaller than 100 Ohm/square. However, the highest records of the graphene film still remain about ~500 Ohm/square of sheet resistance, ~90% of transparency, and a scale of several centimeters.

In order to solve the problems, the present disclosure provides a roll-to-roll doping method of a graphene film, which includes doping the graphene film by immersing the graphene film in a doping solution containing a dopant and passing the graphene film through the solution, or passing the graphene film through a dopant vapor generated by vaporizing the doping solution by using a roll-to-roll process, a graphene film doped by the method, and a roll-to-roll doping apparatus of a graphene film.

However, problems sought to be solved by the present disclosure are not limited to the above-described problems. Other problems to be solved by the present disclosure, which are not described herein, can be clearly understood by those skilled in the art from the descriptions below.

BRIEF SUMMARY OF THE INVENTION

In order to accomplish the above-described object, one aspect of the present disclosure provides a roll-to-roll doping method of a graphene film, which includes doping the graphene film by passing the graphene film through a doping solution containing a dopant or a dopant vapor, by using a roll-to-roll process.

Another aspect of the present disclosure provides a doped graphene film formed by the doping method of the illustrative embodiment.

Another aspect of the present disclosure provides a device including the doped graphene film formed by the doping method of the illustrative embodiment.

Another aspect of the present disclosure provides a roll-to-roll doping apparatus including: a first roller unit that forms a layered structure including a substrate-graphene film-first flexible substrate; a second roller unit that removes the substrate from the layered structure by immersing the layered structure provided by the first roller unit in an etching solution and transfers the graphene film on the first flexible substrate at the same time; a third roller unit that transfers the graphene film transferred to the first flexible substrate on a second flexible substrate; and a fourth roller unit that dopes the graphene film by passing the graphene film through a doping solution or a dopant vapor and that is placed between the second roller unit and the third roller unit, or next to the third roller unit.

In accordance with the present disclosure, a large scale graphene film can be easily doped by the roll-to-roll process. Through the roll-to-roll process, it is possible to provide a method enabling doping of graphene itself by transferring and stacking at least two layers of the graphene film.

The graphene film doped by the doping method of the present disclosure may improve an electrical characteristic, sheet resistance, and transparency. Accordingly, the graphene film doped by the roll-to-roll process can be used in fabricating various devices. For example, the graphene film doped by the roll-to-roll process may be used as an electrode material or the like for various devices.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments and examples will be described in detail with reference to the accompanying drawings so that the inventive concept may be readily implemented by those skilled in the art.

However, it is to be noted that the present disclosure is not limited to the illustrative embodiments, and can be realized in various other ways. In the drawings, certain parts not directly relevant to descriptions of the present disclosure are omitted to enhance the clarity of the drawings. Throughout the whole document, like reference numerals denote like parts.

Throughout the whole document, the term "on" that is used to designate a position of one element with respect to another element includes both a case that the one element is adjacent to the another element and a case that any other element exists between these two elements. Further, the term "comprises or includes" and/or "comprising or including" used in the document means that one or more other components, steps, operation and/or existence or addition of elements are not excluded in addition to the described components, steps, operation and/or elements unless context dictates otherwise.

The terms "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party.

Throughout the whole document, the term "graphene film" means a layer or sheet form of graphene, in which multiple carbon atoms are covalently bonded to one another, thereby forming polycyclic aromatic molecules. The covalently bonded carbon atoms form a 6 circular ring as a basic repeat unit, but may further include 5 and/or 7 circular rings. Accordingly, the graphene layer appears to be a monolayer of the covalently bonded carbon atoms (in general, $sp^2$ bond). The graphene layer may have various structures. The structure of the graphene layer may vary depending on a content of the 5 and/or 7 circular rings that may be included in the graphene. The graphene layer may be formed of a monolayer of graphene as described above, but several graphene layers may be stacked, thereby forming multiple layers. In general, a side end part of the graphene may be saturated with hydrogen atoms.

Throughout the whole document, the term "roller unit" means a device in a roll-to-roll form, which is composed of one roller or multiple rollers, and is not limited with respect to a shape, a size, and/or an arrangement form of a roller.

A roll-to-roll doping method of a graphene film in accordance with one aspect of the present disclosure includes doping the graphene film by passing the graphene film through a doping solution containing a dopant or a dopant vapor, by using a roll-to-roll process. More specifically, the graphene film can be doped through contact with a dopant gas by immersing the graphene film in a solution containing a dopant and passing the graphene film through the solution by using the roll-to-roll process, or passing the graphene film through a dopant vapor generated by vaporizing the doping solution by using the roll-to-roll process.

In an illustrative embodiment, the roll-to-roll doping method of the graphene film includes: forming a layered structure including a substrate-graphene film-first flexible substrate from the graphene film formed on a substrate and the first flexible substrate in contact with the graphene film by a first roller unit; immersing the layered structure in an etching solution and passing the layered structure through the etching solution by using a second roller unit to remove the substrate from the layered structure and to transfer the graphene film on the first flexible substrate at the same time; and transferring the graphene film transferred on the first flexible substrate on a second flexible substrate by using a third roller unit, wherein the graphene film is doped by a fourth roller unit by passing the graphene film through the doping solution containing a dopant or a dopant vapor after transferring the graphene film on the first flexible substrate or after transferring the graphene film on the second flexible substrate. However, the illustrative embodiment is not limited thereto.

In an illustrative embodiment, the substrate may have one or more characteristics of transparency, flexibility, and extendibility. However, the illustrative embodiment is not limited thereto.

In an illustrative embodiment, the dopant may include an organic dopant, an inorganic dopant, or their combination. However, the illustrative embodiment is not limited thereto.

In an illustrative embodiment, the dopant may include at least one selected from the group consisting of an ionic liquid, an ionic gas, an acidic compound, an organic compound, and an organic polymeric compound. For example, the dopant may include at least one selected from the group consisting of $NO_2BF_4$, $NOBF_4$, $NO_2SbF_6$, HCl, $H_3PO_4$, $CH_3COOH$, $H_2SO_4$, $HNO_3$, PVDF, Nafion, $AuCl_3$, $SOCl_2$, $Br_2$, $CH_3NO_2$, dichlorodicyanoquinone, oxone, dimyristoylphosphatidylinositol, and trifluoromethanesulfonimide. However, the illustrative embodiment is not limited thereto. The solution containing the dopant is contained in a vessel (not illustrated).

In an illustrative embodiment, the roll-to-roll doping method of the graphene film may include performing stacking an additional graphene film on the doped graphene film to form a multilayer graphene film, and doping the multilayer graphene film by using the roll-to-roll doping method of the graphene film, in turn at least one time. However, the illustrative embodiment is not limited thereto.

In an illustrative embodiment, the graphene film is transferred and stacked to form at least two layers by using the roll-to-roll process such that the graphene itself can be doped.

In an illustrative embodiment, the roll-to-roll method of the graphene film may include performing one or more times of a process including stacking an additional graphene film on the doped graphene film and doping the stacked graphene film by the roll-to-roll doping method. However, the illustrative embodiment is not limited thereto.

In an illustrative embodiment, the roll-to-roll method of the graphene film may further include forming a protective layer on the doped graphene film by using a fifth roller unit. However, the illustrative embodiment is not limited thereto.

In an illustrative embodiment, the roll-to-roll method of the graphene film may further include a process of cleaning and/or drying the doped graphene film. However, the illustrative embodiment is not limited thereto.

In an illustrative embodiment, the first and second flexible substrates may include polymers, respectively. However, the illustrative embodiment is not limited thereto. For example, the first and second flexible substrates may be thermal release polymers, respectively.

In an illustrative embodiment, the graphene film may be formed on a substrate. The substrate may have at least one characteristic of transparency, flexibility, and extendibility. However, the illustrative embodiment is not limited thereto.

In an illustrative embodiment, the substrate may further include a catalyst layer. However, the illustrative embodiment is not limited thereto. For example, the substrate or the catalyst layer on the substrate may independently include at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. However, the illustrative embodiment is not limited thereto.

In an illustrative embodiment, the graphene film may include a monolayer or a multilayer graphene. As an unlimited example, thickness of the graphene film can be adjusted in a range of about 1 to about 50 layers. If more layers of graphene than the above range are formed, a physical property of graphite, and not a physical property of graphene itself, may be obtained.

In an illustrative embodiment, the graphene film formed on the substrate may be formed by supplying heat and a reaction gas containing a carbon source to the substrate to grow graphene on the substrate. However, the illustrative embodiment is not limited thereto.

In an illustrative embodiment, the doped graphene film may have a roll shape, a foil shape, a tube shape, a plate shape, a sheet shape or a wire shape. However, the illustrative embodiment is not limited thereto.

Another aspect of the present disclosure provides a graphene film doped by the doping method of the illustrative embodiment.

Another aspect of the present disclosure provides a device including the graphene film doped by the doping method of the illustrative embodiment. All the descriptions of the roll-to-roll doping method of the graphene film may be applied to the doped graphene film, and the device including the doped graphene film. For convenience, overlapping descriptions are omitted.

The roll-to-roll doping apparatus of graphene in accordance with another aspect of the present disclosure includes: a first roller unit that forms a layered structure including a substrate-graphene film-first flexible substrate; a second roller unit that removes the substrate from the layered structure by immersing the layered structure provided by the first roller unit in an etching solution and transfers the graphene film on the first flexible substrate at the same time; a third roller unit that transfers the graphene film transferred on the first flexible substrate on a second flexible substrate; and a fourth roller unit that dopes the graphene film by passing the graphene film through a doping solution or a dopant vapor and that is placed between the second roller unit and the third roller unit, or next to the third roller unit.

Hereinafter, the roll-to-roll doping method of the graphene film, the doped graphene film, and the graphene roll-to-roll doping apparatus in accordance with the present disclosure will be described in detail with reference to the drawings. However, the present disclosure is not limited thereto.

Figure 1:
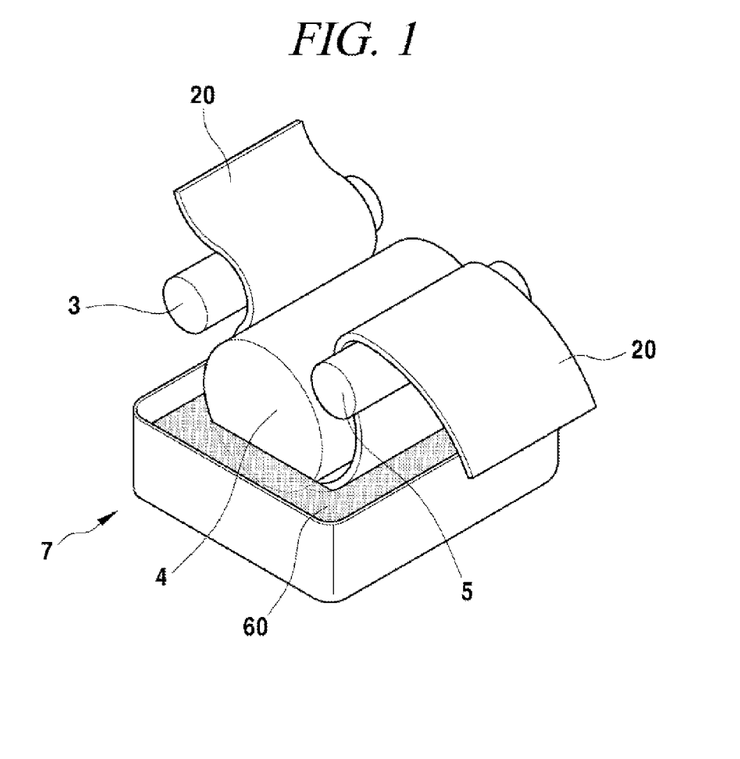
FIG. 1 is a schematic view showing a roll-to-roll doping apparatus of a graphene film and a roll-to-roll doping method of a graphene film using the apparatus in accordance with an illustrative embodiment.

FIG. 1 shows the roll-to-roll doping apparatus of the graphene film and the roll-to-roll doping method of the graphene film using the apparatus. With reference to FIG. 1, the doping apparatus of the graphene film 20 in accordance with the present disclosure may include: a first roller 3 that provides the graphene film into a doping solution or a dopant vapor; a second roller 4 that immerses the graphene film provided by the first roller in the doping solution or passes the graphene film provided by the first roller through the dopant vapor; and a third roller 5 that discharges the graphene film, which has passed through the doping solution and been doped by the second roller, out of the vessel containing the doping solution or the dopant vapor.

The roll-to-roll doping apparatus of the graphene film may further include a roller (not illustrated) that performs a screen printing process to improve adhesion of the graphene film prior to and after the doping. Specifically, the rollers may be added to the first roller 3 and the third roller 5, respectively. Accordingly, when the graphene film passes through the first roller 3 and the third roller 5, a protective layer may be inserted so as to minimize scratch and damage of the graphene. Since the first roller 3 and the third roller 5 contact directly with the graphene, the first roller and the third roller cause scratches thereby resulting in damage to the graphene surface when the rollers are immersed in the doping solution (or come out of the doping solution). Accordingly, soft graphene protective layers (PET, PTFE, and PVDF, etc.) may be inserted into the first roller 3 and the third roller 5, respectively, so as to minimize scratch and damage of the graphene, and improve adhesion between the graphene and a target substrate. To this end, the roll-to-roll doping apparatus of the graphene film may further include the roller for performing the screen printing process. Materials for the protective layers are not limited. For example, the protective layers may include poly methyl methacrylate (PMMA), photoresist (PR), electron resist (ER), SiOx, and AlOx. However, the illustrative embodiment is not limited thereto.

The graphene film may be a graphene film doped with an organic dopant and/or an inorganic dopant. For example, the dopant may include at least one selected from the group consisting of an ionic liquid, an ionic gas, an acidic compound, and an organic compound. The dopant may include at least one selected from the group consisting of $NO_2BF_4$, $NOBF_4$, $NO_2SbF_6$, HCl, $H_3PO_4$, $CH_3COOH$, $H_2SO_4$, $HNO_3$, PVDF, Nafion, $AuCl_3$, $SOCl_2$, $Br_2$, $CH_3NO_2$, dichlorodicyanoquinone, oxone, dimyristoylphosphatidylinositol, and trifluoromethanesulfonimide. However, the illustrative embodiment is not limited thereto.

If the dopant vapor is used during the doping process, the dopant vapor may be formed by a heating device for vaporizing the doping solution in a vessel containing the doping solution. If the doping solution is used during the doping process, a vessel provided with a height adjustment device to adjust an interval between the graphene film and the dopant solution may be used as the vessel containing the doping solution.

During the doping process, the characteristics of the doped graphene film, which is formed through the doping process, can be adjusted by varying the dopant and/or a doping time. For example, sheet resistance and transparency of the doped graphene film can be adjusted by varying the dopant and/or the doping time.

Figure 2:
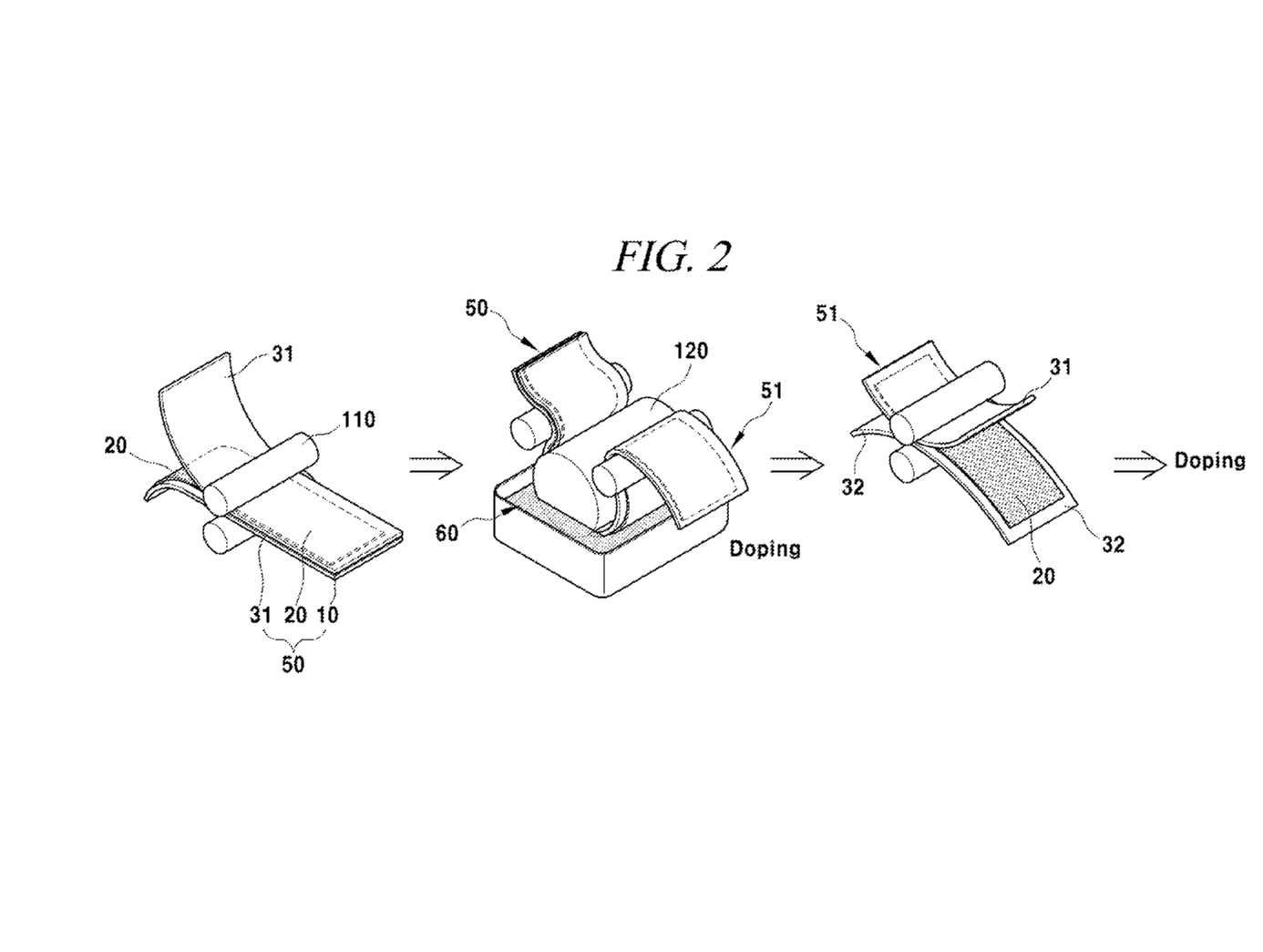
FIG. 2 is a schematic view showing a roll-to-roll doping and transferring method of a graphene film in accordance with an illustrative embodiment.
Figure 3:
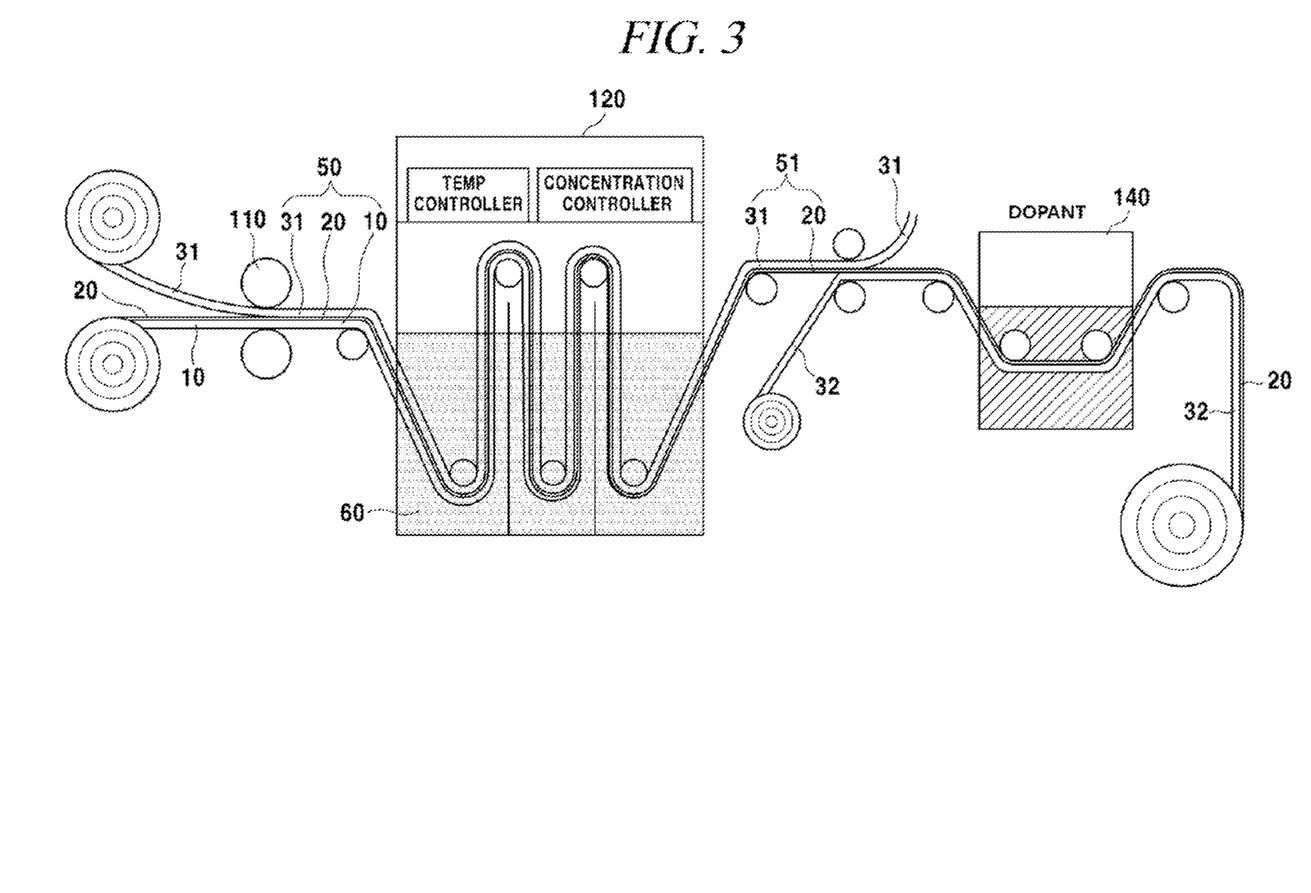
FIG. 3 is a cross-sectional view showing a roll-to-roll doping and transferring method of a graphene film in accordance with an illustrative embodiment.
Figure 4:
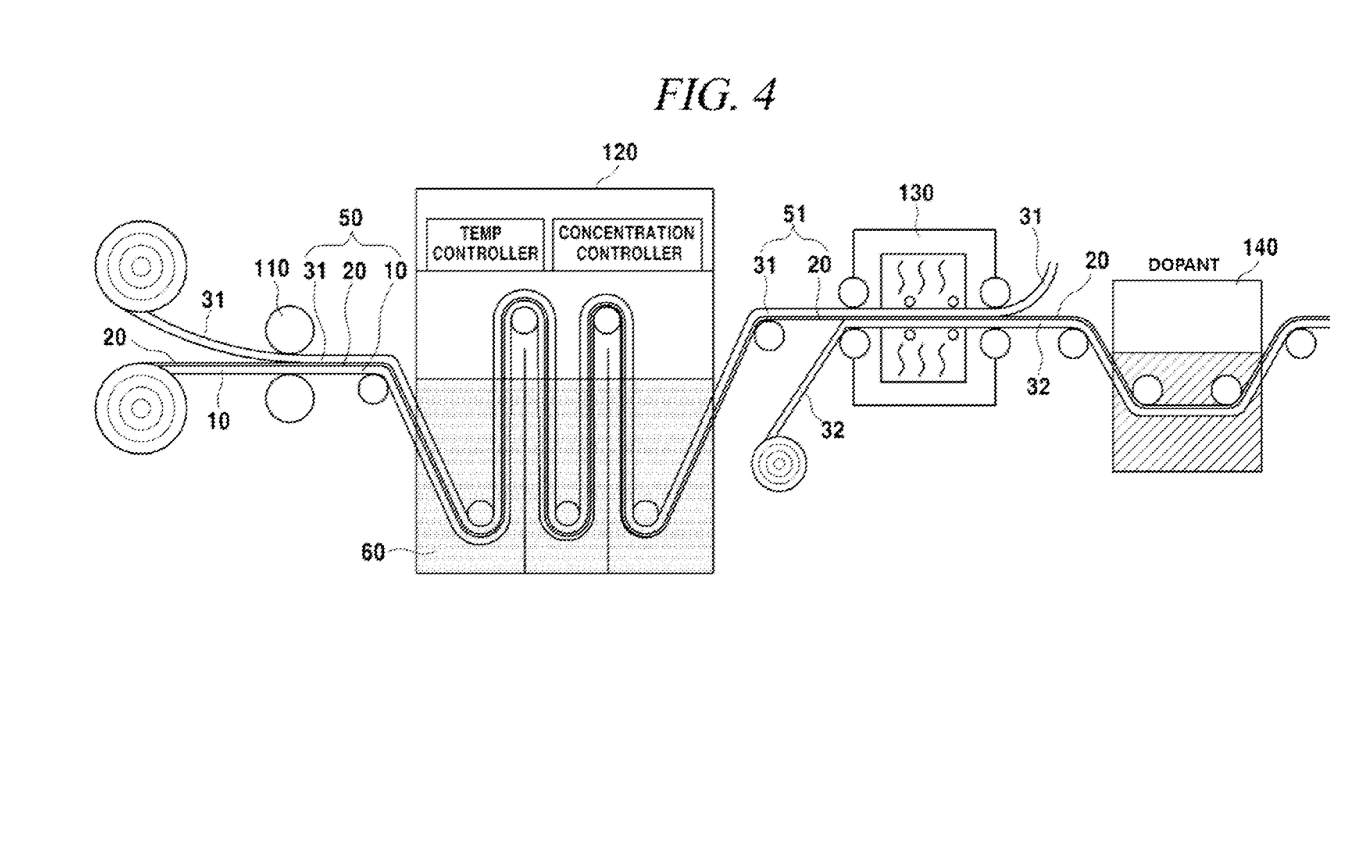
FIG. 4 is a cross-sectional view showing a roll-to-roll doping and transferring method of a graphene film in accordance with another illustrative embodiment.

FIG. 2 shows a roll-to-roll transferring and doping method of the graphene film formed on a substrate. More specifically, the method for doping the graphene film on the substrate may include: (S1) forming a layered structure 50 including a substrate 10-graphene film 20-first flexible substrate 31 from the graphene film 20 formed on a substrate 10 and the first flexible substrate 31 in contact with the graphene film by a first roller unit 110; (S2) immersing the layered structure in an etching solution and passing the layered structure through the etching solution by using a second roller unit 120 to remove the substrate 10 from the layered structure 50 and to transfer the graphene film 20 on the first flexible substrate 31 at the same time; and (S3) transferring the graphene film transferred on the first flexible substrate on a second flexible substrate 32 by using a third roller unit 130, wherein the graphene film is doped by a fourth roller unit 140 after (S2) transferring the graphene film on the first flexible substrate or after (S3) transferring the graphene film on the second flexible substrate. For example, the first roller unit may be an adhesive roller and the second and third roller units may be transfer rollers. However, the illustrative embodiment is not limited thereto. With reference to FIGS. 3 and 4, the doping process may be performed after S2 as illustrated in FIG. 3 or after S3 as illustrated in FIG. 4. If necessary, the roll-to-roll doping method of the graphene film may further include a process for cleaning and/or drying the doped graphene film. However, the illustrative embodiment is not limited thereto.

More specifically, in S1, the first flexible substrate 31 is in contact with the graphene film formed on the above-described substrate and provided to the first roller unit 110. The first flexible substrate may further include an adhesive layer formed thereon to facilitate transfer of the graphene film from the substrate. Materials for the adhesive layer are not limited. Any materials can be used if they are generally used by those skilled in the art to facilitate the transfer. For example, the adhesive layer may include an adhesive tape, a glue, an epoxy resin, a photosoftening tape (UV visible light, an electron beam, and UV/EB), a thermal release tape, a water-soluble tape and the like. However, the illustrative embodiment is not limited thereto.

Through the above-described method, the graphene layer 20 on the substrate 10 and the first flexible substrate 31 are in contact with each other and pass through the first roller unit 110, so that a layered structure 50 of the metal substrate-graphene layer-first flexible substrate is formed. Thereafter, a cooling or plasma process for the layered structure may be further performed as a pre-treatment process before the layered structure is provided to the second roller unit 120. The first roller unit 110 may be composed of a pair of a lower roller and an upper roller, which are facing to each other, as illustrated in FIG. 3. If necessary, however, multiple rollers may be further included in the first roller unit. For example, if the process of S1 is lengthened, in order to prevent downward bending or drooping of the graphene layer on the metal substrate to be introduced, the first flexible substrate, or the layered structure, multiple rollers may be further included.

Subsequently, the layered structure 50 is immersed in the etching solution 60 and pass through the etching solution 60 by using the second roller unit 120 so that the substrate is removed from the layered structure, and the graphene film is transferred on the first flexible substrate at the same time (S2). The etching solution is an aqueous solution, which is capable of selectively etching only a substrate or a substrate containing a catalyst layer. For example, the etching solution may be a solution containing ammonium persulfate $(NH_4)_2S_2O_8$, HF, BOE, $Fe(NO_3)_3$, iron chloride (Iron(III) Chloride, $FeCl_3$), $CuCl_2$, or others. However, the illustrative embodiment is not limited thereto. The etching solution may be selected depending on a type of a substrate. For example, if the substrate is Ni or Cu, the etching process may be performed by $FeCl_3$. In addition to the above-described etching method, reaction ion etching, ion milling, asking, or others may be used to remove the substrate.

The process for removing the metal substrate through the etching process may be performed one time or several times, if necessary. For example, the etching process may be performed one time, or several times by the second roller unit 120 as illustrated in FIG. 3. With reference to FIG. 3, in the etching process, multiple rollers are repeatedly arranged in upper and lower portions of a chamber such that the layered structure can be immersed in the etching solution several times and pass through the solution. By repeatedly performing the etching process several times, the substrate that the layered structure contains or the substrate containing the catalyst layer can be more thoroughly removed.

If the flexible substrate is a thermal release polymer, heat processing may be performed simultaneously with the rolling process so that the graphene film can be easily detached from the flexible substrate. Through the heat processing, transferring and doping of a large scale graphene film can be more easily performed in a short time with low costs.

Here, the substrate 10 may exist solely or further contain a catalyst layer (not illustrated). Materials for the substrate are not limited. For example, the substrate may include at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. If the substrate is a metal, the metal substrate may function as a catalyst to form the graphene film. However, the substrate does not have to be a metal. For example, silicon may be used for the substrate. In order to form a catalyst layer on the silicon substrate, a substrate, on which a silicon oxide layer is further formed through oxidization of the silicon substrate, may be used.

In order to facilitate growth of the graphene film 20 on the substrate 10, a catalyst layer may be further formed thereon. Materials, thickness, and a shape of the catalyst layer are not limited. For example, the catalyst layer may be at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. The catalyst layer may be formed of materials identical or different from those of the substrate. The thickness of the catalyst layer is not limited. The catalyst layer may be a thin or thick film.

As the method for forming the graphene film 20 on the substrate 10, a chemical vapor deposition method, which is generally used in the art of the present disclosure to grow the graphene, may be used without limitation. For example, the chemical vapor deposition method may include rapid thermal chemical vapor deposition (RTCVD), inductively coupled plasma-chemical vapor deposition (ICP-CVD), low pressure chemical vapor deposition (LPCVD), (atmospheric pressure chemical vapor deposition (APCVD), metal organic chemical vapor deposition (MOCVD), or plasma-enhanced chemical vapor deposition (PECVD). However, the illustrative embodiment is not limited thereto.

As an example for forming the graphene film on the substrate, a reaction gas containing a carbon source and heat may be supplied to the substrate containing a catalyst so as to form the graphene film. For example, a quartz tube reactor having an 8-inch diameter may be introduced into a CVD system. In this case, for example, a monolayer graphene film may be formed on a large scale Cu foil roll having an about 30-inch diagonal length. Generally, a temperature gradient within a tube-shaped reactor is large in a radiation direction. Accordingly, the graphene growth on the Cu foil becomes ununiformed. In order to solve the problem, for example, a ~7.5 inch quartz tube wrapped with the Cu foil is inserted into a ~8 inch quartz tube and fixed therein. Accordingly, the ununiformity in the radiation direction at a reaction temperature can be minimized.

The process for growing the graphene film 20 may be performed at atmospheric pressure, a low pressure, or under vacuum. For example, if the process is performed under the condition of atmospheric pressure, helium (He) or the like may be used as a carrier gas to minimize damage to the graphene caused by collision with heavy argon (Ar) at a high temperature. Also, if the process is performed under the condition of atmospheric pressure, the large scale graphene film can be made through a simple process with low costs. If the process is performed under the condition of the low pressure or vacuum, hydrogen ($H_2$) may be used as an atmosphere gas while increasing a temperature, so that an oxidized surface of a metal catalyst is reduced, and high quality graphene can be synthesized.

The graphene film 20 formed by the above-described method may have a large scale with a horizontal or vertical length of more than about 1 mm to about 1,000 m. The graphene film 20 includes a graphene film having little deficits, i.e., a homogeneous structure. The graphene film formed by the above-described method may include monolayer or multilayer graphene. As an unlimited example, thickness of the graphene film may be adjusted in a range of about 1 or about 50 layers.

In the illustrative embodiment for forming the graphene film 20 on the substrate 10, the graphene film is grown by putting the metal substrate in a roll form into a tube-shaped furnace, supplying a reaction gas containing a carbon source, and performing heat processing at atmospheric pressure, and the layered structure 50 of the metal substrate-graphene film-first flexible substrate is formed by contacting the graphene film 20 formed on the metal substrate with the first flexible substrate 31 by using the first roller unit 110. If a heat processing is performed in a range of, for example, from about 300° C. to about 2000° C. while the carbon source such as carbon monoxide, carbon dioxide, methane, ethane, ethylene, ethanol, acetylene, propane, butane, butadiene, pentane, pentene, cyclopentadiene, hexane, cyclohexane, benzene, toluene is supplied in the form of gas, carbon components contained in the carbon source are combined with each other to form a hexagonal plate structure and the graphene layer can be grown.

As described above, the roll-to-roll transferring method of the graphene film enables transfer and doping of the graphene film on various substrates with low costs through a simple process. Since the graphene has high transparency, it may be applied to fabricating various electrical and electronic devices. Especially, the graphene may be effectively used in fabricating electrodes of various electrical and electronic devices. For example, it is possible to realize effective utilization of graphene transparent electrodes for photoelectromagnetic application in fabricating electrodes of various electrical and electronic devices such as a next-generation field effect transistor requiring flexibility and/or extendibility, or a diode, or in the field of a solar cell, a touch sensor, and related flexible electronic technologies. Through the doping process by the roll-to-roll process, the electrical characteristic of the graphene film is improved. Further, sheet resistance and transparency, which are equivalent to recent commercial transparent electrodes such as indium tin oxide, can be exhibited.

Hereinafter, examples for the roll-to-roll doping method of the graphene film and the graphene film formed by the method in accordance with the present disclosure will be described in detail with reference to the drawings. However, the present disclosure is not limited thereto.

Example 1

1. Growth of a Large Scale Graphene Film on a Copper Foil

A ~7.5 inch quartz tube was wrapped with a Cu substrate (thickness: 25 μm; size: 210×297 mm²; Alfa Aesar Co.) to form a roll of the Cu substrate. The quartz tube was inserted into a ~8 inch quartz tube and fixed therein. Thereafter, the quartz tube was heated to 1,000° C. while flowing 10 sccm $H_2$ at 180 mTorr. After the temperature of the quartz tube reaches 1,000° C., annealing was performed for 30 minutes while maintaining the hydrogen flow and the pressure. Subsequently, a gas mixture ($CH_4$:$H_2$=30:10 sccm) containing a carbon source was supplied at 1.6 Torr for 15 minutes such that graphene was grown on the Cu substrate. Thereafter, the graphene was cooled to a room temperature at a rate of 10° C./s within a short time while flowing $H_2$ at a pressure of 180 mTorr. As a result, a graphene film grown on the Cu substrate was obtained.

2. A Chemical Doping Method of a Graphene Film

Resistivity may be presented by the formula of $\rho=1/\sigma$ (or $1/ne\mu$). In order to improve conductivity, there is a method of increasing mobility ($\mu$) or a carrier concentration. If doping is performed through chemical treatment, conductivity can be improved by increasing the carrier concentration. If $AuCl_3$ is used as a dopant, the doping principle of the graphene is that $Au^{3+}$ ions dissolved in a salt state in a solution receive electrons from the surface of the graphene film so that Au particles are formed on the surface of the graphene. Accordingly, the Au particles take the electrons from the graphene so that strong p-doping occurs. As identified from the graphene band structure, a Fermi level decreases, thereby increasing the carrier concentration. According to the formula of $\sigma=ne\mu$, the conductivity is improved.

With respect to leading analysis methods to measure a degree of doping of the graphene, there are three methods as set forth hereinafter. Firstly, the carrier concentration and a degree of variation of a Dirac point can be identified through fabrication of a hall bar device. If the Raman analysis method is used, a degree of p-type doping and n-type doping can be qualitatively identified through intensity of a peak and a shift direction. In case of the p-type doping, blue shift of G- and 2D-band peaks occurs, and intensity of the 2D-band peak tends to be weakened. In case of the n-type doping, red shift of the G-band peak occurs, and blue shift of the 2D-band peak occurs. If XPS is used, absorption materials on the surface of the graphene can be sorted, and a degree of doping can be identified through a shift direction and intensity of a C1s peak.

3. Transfer and Roll-to-Roll Doping Process of a Graphene Film

A thermal release tape (Jin Sung Chemical Co. and Nitto Denco Co.) was contacted with the graphene film formed on the Cu substrate, and thereafter, was passed through the adhesive roller including two rollers while applying a weak pressure of ~2 MPa so that the graphene film was adhered on the thermal release tape. Next, the layered structure of Cu substrate/graphene film/thermal release tape was immersed in a 0.5 M $FeCl_3$ or 0.15 M $(NH_4)_2S_2O_8$ etching aqueous solution to etch and remove the Cu substrate through electro-chemical reaction so that a layered structure of the graphene film/the thermal release tape was obtained. Thereafter, the graphene film was cleaned with deionized water to remove residual etching components. Next, a target substrate was contacted with the graphene film transferred to the thermal release tape. Thereafter, the target substrate and the graphene film passed through the transfer roller while applying low heat of 90~120° C. for ~5 minutes. As a result, the graphene film was transferred from the thermal release tape on the target substrate. If necessary, the above-described processes may be repeatedly performed on the same target substrate, so that a multilayer graphene film can be transferred on the target substrate. As the target substrate, for example, polyethylene terephthalate (PET) having a 34-inch scale in a diagonal direction and thickness of 188 μm may be used.

Subsequently, at least one layer of the graphene film transferred on the target substrate was doped through the roll-to-roll process as shown in the above-described embodiments and FIGS. 1 to 4. Specifically, the graphene film was p-doped by immersing at least one layer of the graphene film transferred on the target substrate in a solution containing 63 wt % $HNO_3$ for about 5 minutes and passing the graphene film through the solution by using the roll-to-roll transferring device as shown in FIG. 1.

Figure 5A:
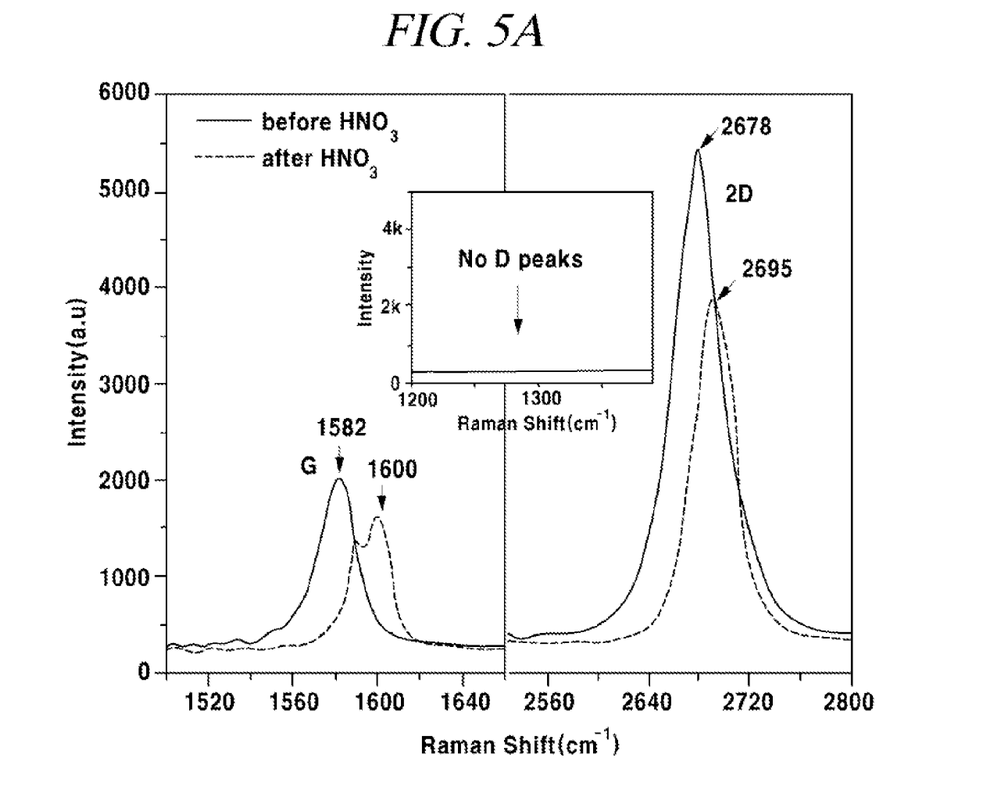
FIGS. 5A and 5B are graphs respectively showing a Raman spectrum of a doped graphene film and a X-ray photoelectron spectrum (XPS) expanded by doping in accordance with an example of an illustrative embodiment.
Figure 5B:
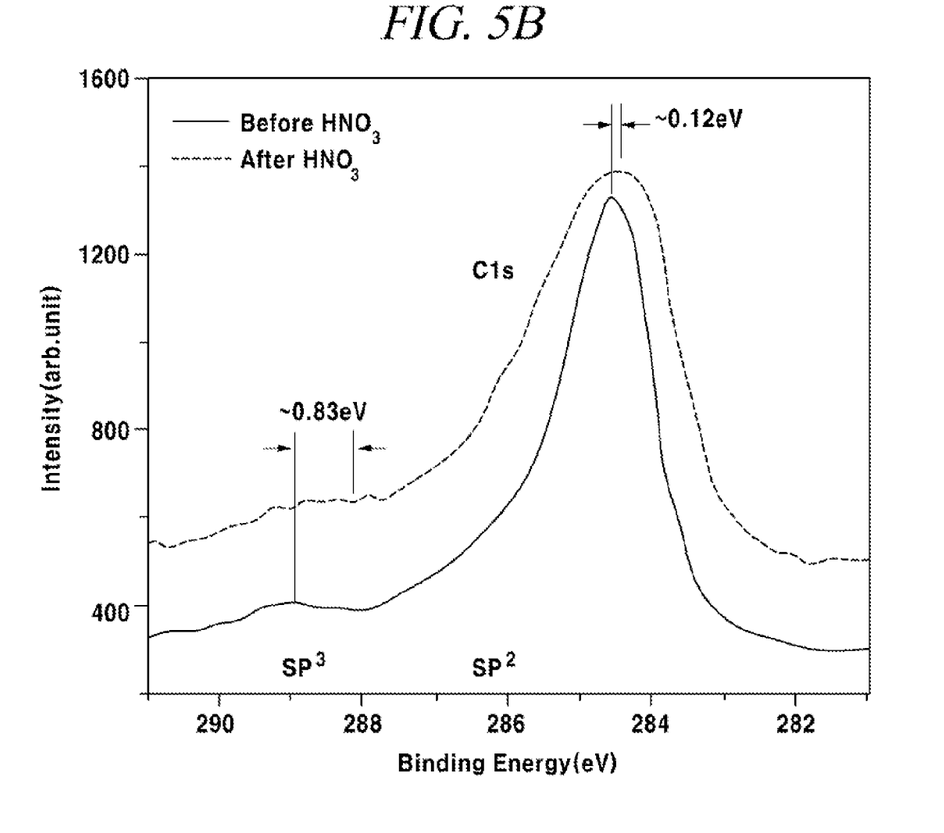

FIG. 5 shows a Raman spectrum (on $SiO_2$ (300 nm)/Si) of the p-doped graphene film transferred to the PET target substrate roll having the thickness of 188 μm in accordance with the example of the illustrative embodiment, and a X-ray photoelectron spectrum (XPS) showing red-shift and peak broadening by the p-doping. FIG. 5A is a Raman spectrum of a $HNO_3$-doped graphene film, showing ~18 $cm^{-1}$ blue shift of both the G and 2D peaks. Here, a D band peak was not observed prior to and after the doping. This means that the $HNO_3$ treatment does not break the chemical bond of the graphene. FIG. 5B is an X-ray photoelectron spectrum (XPS) showing typical red-shift and peak broadening by the p-doing. The spectrum may be understood as re-hybridization of molecule orbitals into an intermediate state between $sp^2$ and $sp^3$.

Due to the unique electronic band structure of the graphene, charge carrier density significantly increases through the p or n-doping, thereby resulting in improvement of the sheet resistance. The inventors of the present disclosure attempted various types of chemical doping methods useful for the carbon nanotube. They discovered that a nitric acid ($HNO_3$) is effective for the p-doping of the graphene film. FIG. 5A shows a Raman spectrum of the graphene film prior to and after doping with 63 wt % (16 M) $HNO_3$ for 5 minutes. A large peak displacement ($\Delta v=18$ $cm^{-1}$) indicates that the graphene film is strongly p-doped. As illustrated in FIG. 5A, the shifted G peak implies appearance of an additional vibration mode caused by the strong p-doping. In X-ray photoelectron spectrum data (FIG. 5B), a new peak is observed between satellite peaks of C1s corresponding to the $sp^2$ and $sp^3$ hybridization state. This indicates variation of the electron structure of the graphene resulting from the strong doping effect.

Figure 6A:
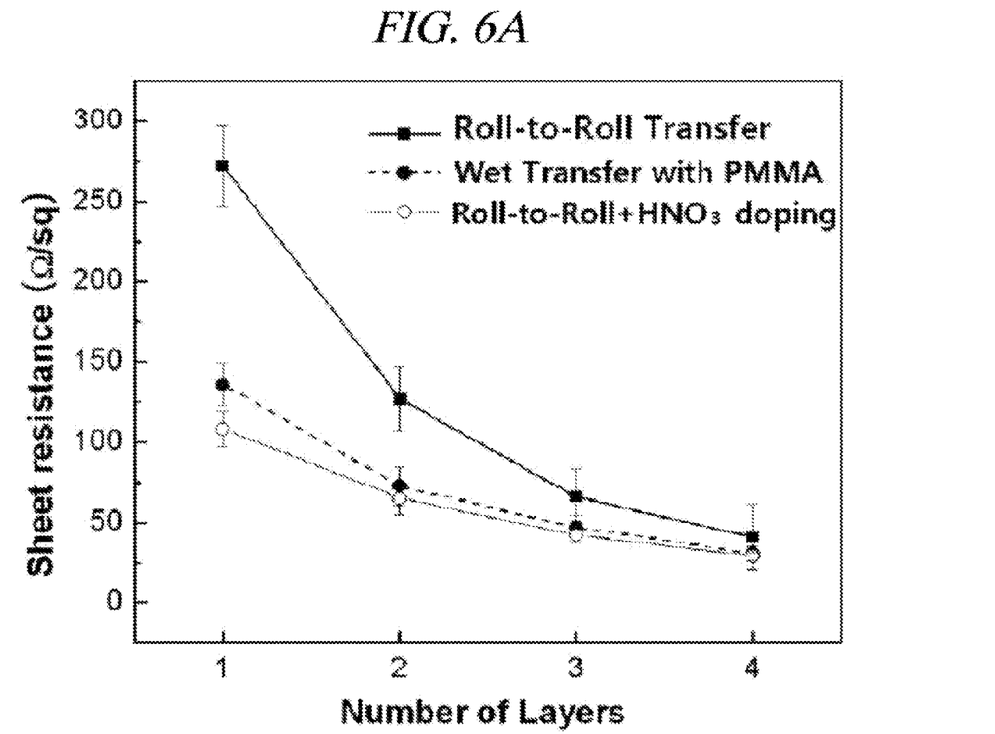
FIG. 6A is a graph showing the sheet resistance of a graphene film in accordance with an example of an illustrative embodiment.
Figure 6B:
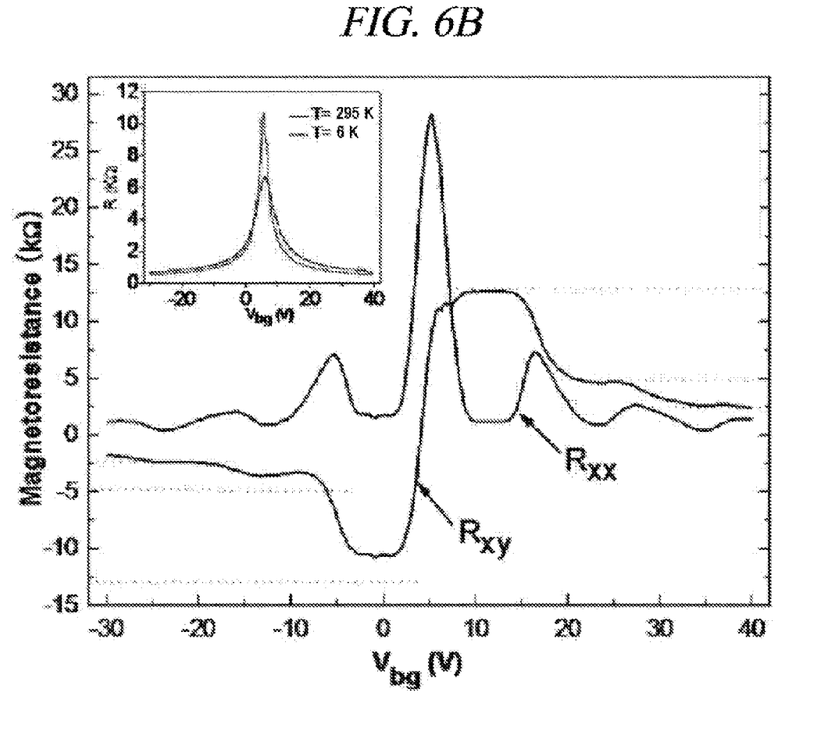
FIG. 6B is a graph showing an electrical characteristic of a monolayer graphene hall bar device in vacuum.

FIG. 6 is a graph showing an electrical characteristic of layer-by-layer transferred and doped graphene film in accordance with the example of the illustrative embodiment. FIG. 6A is a graph for the sheet resistance of the graphene film transferred by using a roll-to-roll dry transfer method combined with the thermal release tape and a PMMA-based wet transfer method. FIG. 6B is a graph showing an electrical characteristic of a monolayer graphene hall bar device in vacuum. With respect to FIG. 6B, 4-point resistivity was measured as a function of a back gate voltage (Vg) in a device at a room temperature and T=6K. A quantum Hall effect (QHE) was measured in the same device under a very low temperature (T=6K) and a high magnetic field (B=9T). Longitudinal resistivity ρxx and hall conductivity σxy were presented as a function of a gate voltage. It is observed that a sequence of three half-integer plateaus corresponding to u=2, 6, and 10, which are typical for the monolayer graphene, was clearly presented. The Hall effect mobility of the device exhibits μHall=7,350 $cm^2V^{-1}$ $s^{-1}$ (~5,100 $cm^2V^{-1}$ $s^{-1}$ at 295 K) at 6K. This shows that the quality of the graphene formed by CVD also has an excellent electrical characteristic equivalent to that of the graphene mechanically released from graphite.

P-doping with $HNO_3$ apparently improves the electrical characteristic of the graphene film, and is more effective for the roll-to-roll produced graphene. The graphene film obtained by stacking 4 layers of a graphene film through the layer-by-layer transferring and doping method exhibited average 90% optical transparency. The sheet resistance of the graphene film was improved from 250 Ω/sq to finally 35 Ω/sq for the monolayer. Accordingly, a highly conductive transparent electrode was produced. Since the transparent electrode is flexible while having optical transmittance and an electrical sheet resistance value, which are comparable with those of ITO, it is expected that many researches as a new material will be performed in various application fields of a transparent electrode.

Figure 7:
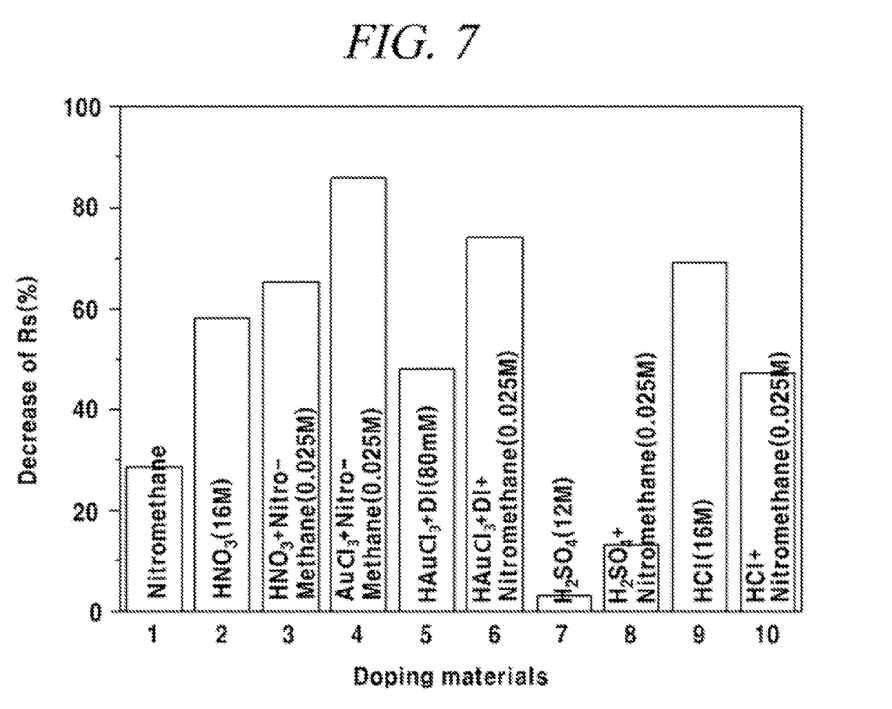
FIG. 7 is a graph obtained from measuring a decrease of sheet resistance of a graphene film doped by varying dopants in accordance with an example of an illustrative embodiment.

FIG. 7 and Table 1 below provide results showing sheet resistance decrease and transparency in the case where the graphene film was doped by varying doping materials for the graphene film.

TABLE 1

| No. | Resistance Decrease (%) | Transparency (%) | Dopant (+Organic Solvent) |
|---|---|---|---|
| 1 | 28.5 | 97.6 | Nitromethane |
| 2 | 58 | 96.1 | $HNO_3$ (16M) |
| 3 | 65 | 96.5 | $HNO_3$ + Nitromethane (0.025 mM) |
| 4 | 85.9 | 87.1 | $AuCl_3$ + Nitromethane (0.025 mM) |
| 5 | 48 | 97.2 | $HAuCl_4$ + DI (80 mM) |
| 6 | 74 | 97 | $HAuCl_4$ + DI + Nitromethane (0.025 mM) |

TABLE 1-continued

| No. | Resistance Decrease (%) | Transparency (%) | Dopant (+Organic Solvent) |
|---|---|---|---|
| 7 | 3 | 81 | $H_2SO_4$ (16 mM) |
| 8 | 13 | 82.4 | $H_2SO_4$ + Nitromethane (0.025 mM) |
| 9 | 69 | 95.3 | HCl |
| 10 | 47 | 96.3 | HCl + Nitromethane (0.025 mM) |
| 11 | −40 | 85 | $H_3PO_4$ |

Figure 8:
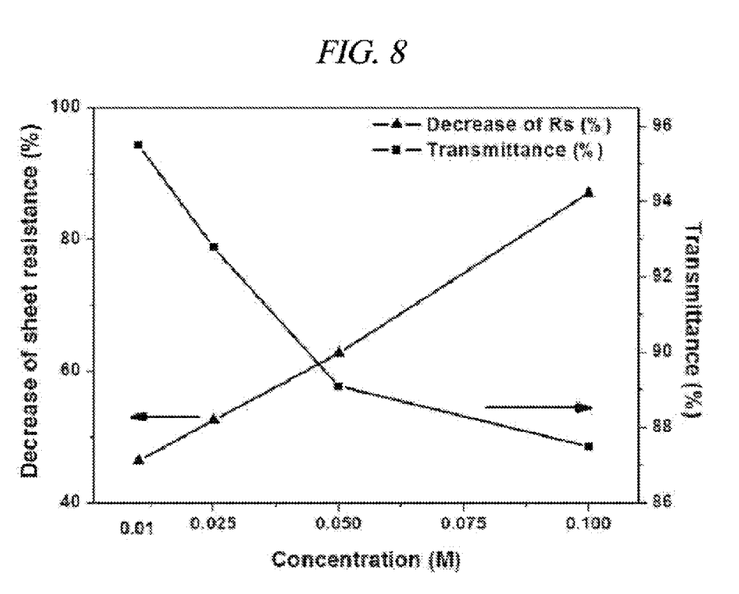
FIG. 8 is a graph showing relation between a decrease of sheet resistance and transparency depending on variation of concentration of a dopant in accordance with an example of an illustrative embodiment.
Figure 9:
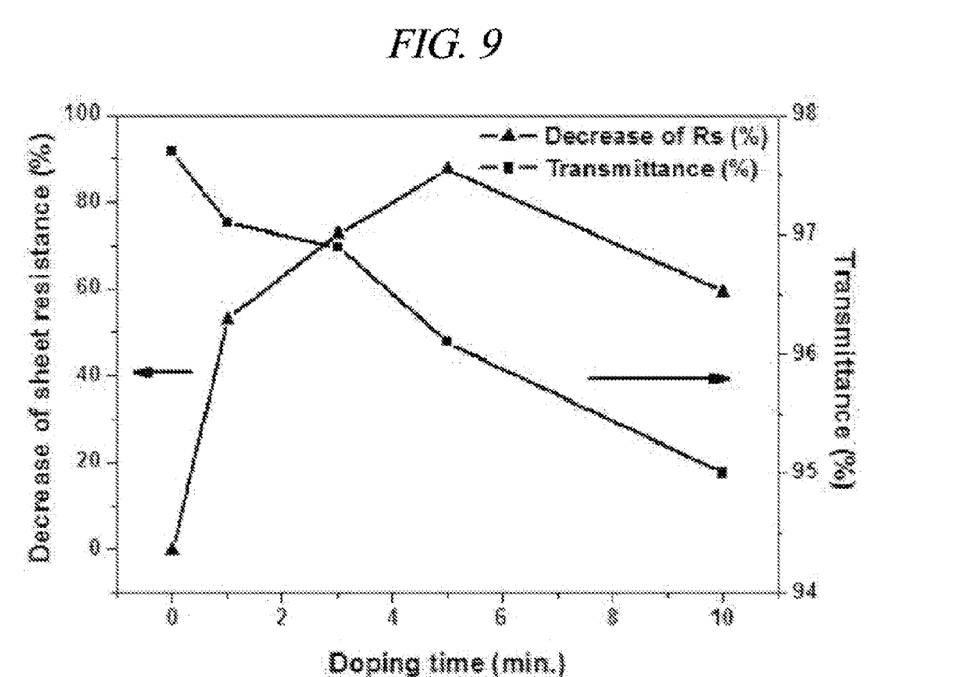
FIG. 9 is a graph showing relation between a decrease of sheet resistance and transparency depending on a doping time in accordance with an example of an illustrative embodiment.

FIGS. 8 and 9 are graphs obtained from observation of sheet resistance and transparency by varying conditions such as a concentration of a dopant and a doping time in case of performing doping through the roll-to-roll doping method of an illustrative embodiment, and by using $AuCl_3$ as a dopant and nitromethane as an organic solvent.

With reference to FIG. 8, decrease of sheet resistance and transparency of the doped graphene film were observed by using $AuCl_3$ as a dopant and nitromethane as an organic solvent, and varying the concentration in a range of from 0.01 M to 0.1 M. As the concentration of the $AuCl_3$ dopant increases, the decrease of the sheet resistance increased from about 46% to about 88%. However, the transparency decreased from about 82% to 54%.

With reference to FIG. 9, the graph was obtained by observing the sheet resistance and the transparency by using $AuCl_3$ as a dopant and nitromethane as an organic solvent, and maintaining a concentration of 0.025 mM. As the doping time increases, the transparency constantly decreases. However, the decrease of the sheet resistance tended to increase up to about 5 minutes, and thereafter, slightly decreased.

The above description of the illustrative embodiments is provided for the purpose of illustration, and it would be understood by those skilled in the art that various changes and modifications may be made without changing technical conception and essential features of the illustrative embodiments.

What is claimed is:

1. A roll-to-roll apparatus for doping a graphene film, comprising:
   a first roller unit that forms a layered structure including a forming substrate, the graphene film and a first flexible substrate;
   a second roller unit configured to immerse the layered structure from the first roller unit into an etching solution while passing the layered structure through the second roller unit to remove the forming substrate from the layered structure, and transfer the graphene film onto the first flexible substrate;
   a third roller unit configured to remove the graphene film from the first flexible substrate while transferring the graphene film onto a second flexible substrate; and
   a fourth roller unit configured to pass the graphene film through a dopant to dope the graphene film.

2. The apparatus of claim 1, wherein the graphene film is doped with an organic dopant, an inorganic dopant or their combination.

3. The apparatus of claim 1, wherein the dopant includes at least one selected from the group consisting of an ionic liquid, an ionic gas, an acidic compound, and an organic polymeric compound.

4. The apparatus of claim 1, wherein the dopant includes at least one selected from the group consisting of $NO_2BF_4$, $NOBF_4$, $NO_2SbF_6$, HCl, $H_2PO_4$, $CH_3COOH$, $H_2SO_4$, $HNO_3$, PVDF, Nafion, $AuCl_3$, $SOCl_2$, $Br_2$, $CH_3NO_2$, dichlorodicyanoquinone, oxone, dimyristoylphosphatidylinositol, and trifluoromethanesulfonimide.

5. The apparatus of claim 1, wherein the graphene film includes a monolayer graphene or a multilayer graphene.

6. The apparatus of claim 1, wherein the graphene film has a roll shape, a foil shape, a tube shape, a plate shape, a sheet shape or a wire shape.

7. The apparatus of claim 1, wherein the fourth roller unit is provided between the second roller unit and the third roller unit, and immerses the graphene film formed on the first flexible substrate through the dopant.

8. The apparatus of claim 1, wherein the fourth roller unit is provided downstream of the third roller unit, and immerses the graphene film formed on the second flexible substrate through the dopant.

9. The apparatus of claim 1, wherein the dopant is provided in a doping solution.

10. The apparatus of claim 1, wherein the dopant is provided in dopant vapor.

* * * * *